United States Patent
Kim et al.

(10) Patent No.: US 9,534,316 B2
(45) Date of Patent: Jan. 3, 2017

(54) SILICON CARBIDE POWDER AND METHOD FOR MANUFACTURING THE SAME

(71) Applicant: LG INNOTEK CO., LTD., Seoul (KR)

(72) Inventors: Byung Sook Kim, Seoul (KR); Dong Geun Shin, Seoul (KR); Bum Sup Kim, Seoul (KR); Jung Eun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/373,579

(22) PCT Filed: Jan. 18, 2013

(86) PCT No.: PCT/KR2013/000442
§ 371 (c)(1),
(2) Date: Jul. 21, 2014

(87) PCT Pub. No.: WO2013/109105
PCT Pub. Date: Jul. 25, 2013

(65) Prior Publication Data
US 2014/0363675 A1    Dec. 11, 2014

(30) Foreign Application Priority Data

Jan. 20, 2012  (KR) .................. 10-2012-0006950

(51) Int. Cl.
| | | |
|---|---|---|
| *C01B 31/00* | (2006.01) | |
| *C30B 25/20* | (2006.01) | |
| *C01B 31/36* | (2006.01) | |
| *C30B 29/36* | (2006.01) | |

(52) U.S. Cl.
CPC .............. *C30B 25/20* (2013.01); *C01B 31/36* (2013.01); *C30B 29/36* (2013.01); *C01P 2004/30* (2013.01); *C01P 2004/32* (2013.01); *C01P 2004/61* (2013.01); *Y10T 428/2982* (2015.01)

(58) Field of Classification Search
None
See application file for complete search history.

(56) References Cited

U.S. PATENT DOCUMENTS

| | | | | |
|---|---|---|---|---|
| 5,093,039 A | * | 3/1992 | Kijima et al. ................. | 252/516 |
| 5,720,933 A | * | 2/1998 | Srinivasan .................... | 423/345 |
| 6,627,169 B1 | | 9/2003 | Itoh et al. | |
| 7,314,593 B2 | | 1/2008 | Bandyopadhyay et al. | |

FOREIGN PATENT DOCUMENTS

| | | | |
|---|---|---|---|
| CA | 2050705 | * | 3/1992 |
| JP | 58-091027 | * | 5/1983 |
| JP | 2000-351614 A | | 12/2000 |
| WO | 2011/025285 | * | 3/2011 |

OTHER PUBLICATIONS

International Search Report in International Application No. PCT/KR2013/000442, filed Jan. 18, 2013.
Kim, G., et al., "Effects of β-SiC Particle Seeds on Morphology and Size of High Purity β-SiC Powder Synthesized using Sol-Gel Process." Journal of the Korean Ceramic Society, vol. 46:5, pp. 528-533, Sep. 2009.
Lim K., et al., "Flexural Strength of Macroporous Silicon Carbide Ceramics." Journal of the Korean Ceramic Society, vol. 48:5, pp. 360-367, Aug. 2011.

* cited by examiner

*Primary Examiner* — Steven Bos
(74) *Attorney, Agent, or Firm* — Saliwanchik, Lloyd & Eisenschenk

(57) ABSTRACT

Disclosed are silicon carbide powders and a method of preparing the same. The method includes forming a mixture by mixing a silicon (Si) source, a carbon (C) source, and a silicon carbide (SiC) seed, and reacting the mixture. The silicon carbide (SiC) powders include silicon carbide (SiC) grains having a β-type crystal phase and a grain size in a range of about 5 μm to about 100 μm.

9 Claims, 1 Drawing Sheet

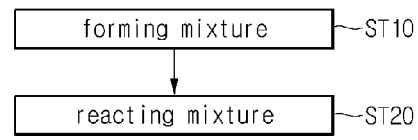

US 9,534,316 B2

SILICON CARBIDE POWDER AND METHOD FOR MANUFACTURING THE SAME

CROSS-REFERENCE TO RELATED APPLICATIONS

This application is the U.S. national stage application of International Patent Application No. PCT/KR2013/000442, filed Jan. 18, 2013, which claims priority to Korean Application No. 10-2012-0006950, filed Jan. 20, 2012, the disclosures of each of which are incorporated herein by reference in their entirety.

TECHNICAL FIELD

The embodiment relates to silicon carbide powders and a method of preparing the same.

BACKGROUND ART

Recently, silicon carbide has been used in various electronic devices as a semi-conductor material for various purposes. In particular, the silicon carbide is very useful because the silicon carbide has the superior physical strength and high resistance against the chemical attack. In addition, the silicon carbide represents the superior electronic characteristics, such as the high radiation hardness, relatively wide bandgap, high saturated electron drift velocity, high operating temperature, and high absorption and emission of quantum energy in the blue, violet and ultraviolet bands of a spectrum.

Silicon carbide powders can be prepared by mixing and heating source materials, such as a silicon source and a carbon source. In order to prepare the silicon carbide powders, an Acheson scheme, a carbon-thermal reduction scheme, a liquid polymer thermal decomposition scheme, and a CVD (Chemical Vapor Deposition) scheme have been generally known to those skilled in the art. In particular, the liquid polymer thermal decomposition scheme or the carbon-thermal reduction scheme is used to synthesize high purity silicon carbide powders.

In general, to prepare silicon carbide sinter through a hot press scheme, silicon carbide powders having a grain size in the range of 0.5 μm and 5 μm are used. In addition, to prepare silicon carbide sinter or grow the single silicon carbide crystal through a reaction sintering scheme, silicon carbide powders having the grain size of 10 μm or more are required.

However, the silicon carbide powders prepared through the above scheme have many difficulties in controlling the grain size thereof. Particularly, to make the grain size beyond the range of 0.5 μm to 5 μm, the silicon carbide powders prepared through the above scheme actually have limitation.

Therefore, a scheme of preparing silicon carbide powders having the grain size of 10 μm or more is required.

DISCLOSURE OF INVENTION

Technical Problem

The embodiment provides silicon carbide (SiC) powders and a method of preparing the same, in which the SiC powders having a desired grain size, particularly, the grain size of 10 μm or more and representing high purity can be synthesized at the low temperature.

Solution to Problem

According to the embodiment, there is provided a method of preparing silicon carbide (SiC) powders. The method includes forming a mixture by mixing a silicon (Si) source including silicon (Si), a carbon (C) source including carbon (C), and a silicon carbide (SiC) seed, and reacting the mixture.

According to the embodiment, there is provided silicon carbide (SiC) powders including silicon carbide (SiC) grains having a β-type crystal phase and a grain size in a range of about 5 μm to about 100 μm.

Advantageous Effects of Invention

As described above, according to the method of preparing silicon carbide (SiC) powders of the embodiment, the Si source, the C source, and the SiC seed are mixed to form a mixture. The SiC formed through the reaction is combined with the SiC seed serving as a core so that grains can be grown. Accordingly, the SiC powders having the grain size of about 10 μm or more can be finally prepared.

Accordingly, the SiC powders can be directly used as a source material to prepare silicon carbide sinter or grow the single SiC crystal through a reaction sintering scheme requiring SiC powders having the grain size of 10 μm or more.

In addition, since the SiC seed having the β-type crystal phase serves as the core of the SiC powders, the SiC powders having the high purity, for example, the purity of 99.999% or more can be prepared.

Therefore, according to the embodiment, the SiC powders having the high purity can be prepared.

In other words, the embodiment can provide the method of preparing the SiC powders, in which the SiC powders can be easily increased in terms of the grain size and can represent high purity.

BRIEF DESCRIPTION OF DRAWINGS

FIG. 1 is a flowchart showing a method of preparing silicon carbide powders according to the embodiment.

MODE FOR THE INVENTION

Hereinafter, a method of preparing silicon carbide powders according to the embodiment will be described in detail with reference to accompanying drawings.

FIG. 1 is a flowchart showing the method of preparing silicon carbide powders according to the embodiment. Preferably, FIG. 1 is a flowchart showing the method of preparing beta-silicon carbide (β-SiC) powders according to the embodiment.

Referring to FIG. 1, the method of preparing β-SiC powders according to the embodiment includes a step of forming a mixture by mixing a silicon (Si) source including Si, a carbon (C) source including C, and a silicon carbide (SiC) seed, and a step of making reaction with the mixture.

Hereinafter, each step will be described in more detail.

According to the step (step ST10) of forming the mixture, the Si source, the C source, and the SiC seed are prepared and mixed to form a mixed source material.

The Si source may include various materials sufficient to provide Si. For example, the Si source may include at least one of silica sol, silicon dioxide, silicon fine powders, and quartz powders. However, the embodiment is not limited thereto, and the Si source may include organosilicic compound including Si.

The silicon source may include a solid carbon source or organic carbon compounds.

The solid carbon source may include at least one of carbon black, carbon nano-tube (CNT), and fullerene (C60).

The organic carbon compounds may include at least one of phenol resin, frane resin, xylene resin, polyimide, polyunrethane, polyacrylonitrile, polyvinyl alcohol, cellulose, sugar manufacture, pitch, and tar.

The silicon carbide seed may include a β-crystal phase with the grain size of about 0.5 μm to about 5 μm. In other words, the silicon carbide seed may include β-SiC powders having the grain size of about 0.5 μm to about 5 μm.

In general, the silicon carbide includes α-SiC having an α-crystal phase and β-SiC having a β-crystal phase. The α-SiC are different from the β-SiC in terms of the crystal structure thereof. The α-SiC has a hexagonal crystal structure, and the β-SiC has a cubic crystal structure. The β-SiC may be converted into the α-SiC that is stabilized at the high temperature.

The β-SiC may be prepared through a direct carbonization scheme, a carbon reduction scheme using a sol-gel process, and a synthesizing scheme using vapor reaction.

Since the β-SiC has the small content of metal impurities such as aluminum (Al), boron (B), calcium (Ca), and iron (Fe), the β-SiC can represent purity higher than that of the α-SiC. Accordingly, the sinter made from the SiC powders may have improved strength and purity.

The Si source, the C source, and the SiC seed may be mixed with each other through a wet mixing process employing a solvent or a dry mixing process that does not employ a solvent. In the case of the wet mixing process, the Si source and the C source may be agglomerated together, so that the productivity can be improved. On the contrary, if the dry mixing process is employed, the cost and the environment pollution resulting from the solvent can be prevented, and the carbonization process can be omitted, so that the processes can be simplified.

The Si source, the C source, and the SiC seed are mixed by using a ball mill or an attrition mill to be collected. The mixed powders may be separated from the Si source, the C source, and the SiC seed by using a sieve and collected.

The Si source and the C source may be mixed with each other at a predetermined mass ratio. For example, the mole ratio of C constituting the C source to Si constituting the Si source (the mole ratio of C to Si) may be in the range of 1:1.5 to about 1:3. If the mole ratio of carbon to silicon exceeds 3, the amount of carbon is so excessive that the amount of residual carbon, which does not participate in the reaction, is increased, lowering the recovery rate. In addition, if the mole ratio of carbon to silicon is less than 1.5, the amount of silicon is so excessive that the amount of residual silicon, which does not participate in the reaction, is increased, lowering the recovery rate. That is, the mole ratio of carbon to silicon must be determined by taking the recovery rate into consideration.

Since the silicon source is volatilized into a gas phase at the high temperature in reaction step ST20, the mole ratio of carbon to silicon is set in the range of 1.8 to 2.7.

In addition, the SiC seed and the Si source may be mixed with each other at a predetermined ratio. In other words, to adjust the grain size of the SiC powders finally prepared, the SiC seed representing a predetermined ratio with respect to the Si source may be mixed. For example, the mole ratio between the SiC seed and the sum of the SiC seed and the Si source may be in the range of about 0.01:1 to about 0.2:1. Preferably, the mole ratio of the SiC seed and the mixture of the SiC seed and the Si source may be in the range of about 0.03:1 to about 0.1:1. In other words, the mole ratio between SiC constituting the SiC seed and the sum of the SiC constituting the SiC seed and Si constituting the Si source may be in the range of about 0.01:1 to about 0.2:1, preferably, in the range of about 0.03:1 to about 0.1:1.

If the mole ratio between the SiC seed and the sum of the SiC seed and the SiC source is out of the above range, the grain size of the SiC powders finally prepared may be 10 μm or less. Accordingly, the SiC powders having the grain size of 10 μm or more may not be prepared.

In addition, the grain size of the SiC seed may be in the range of about 0.5 μm to about 5 μm. In other words, the SiC seed may be β-SiC powders having the grain size of about 0.5 μm to about 5 μm, which are obtained by mixing the Si source and the C source with each other and allowing the mixture to react to each other through the direct carbonization scheme, the carbon reduction scheme using a sol-gel process, and the synthesizing scheme using vapor reaction.

The SiC seed having the grain size of about 0.5 μm to about 5 μm is combined with the SiC powders formed through the reaction of the Si source and the C source, so that the SiC seed is grown as grains. The grain growth will be described later.

The Si source, the C source and the SiC seed are uniformly mixed with each other to form the mixture.

In step ST20 of making reaction with the mixture, the mixture is subject to the reaction to form the SiC powders. In more detail, mixture powders are weighed in a graphite crucible and then the mixture powders are supplied and heated in a high-temperature reaction furnace, such as a graphite furnace. The process to form the SiC powders may be classified into the carbonization process and the synthesis process.

In the carbonization process, the organic carbon compound is carbonized so that carbon may be produced. The carbonization process is performed at the temperature in the range of about 600° C. to about 1200° C. In detail, the carbonization process is performed at the temperature in the range of about 800° C. to about 1100° C. If the solid carbon source is used as the carbon source, the carbonization process may be omitted.

After that, the synthesis process is performed. In the synthesis process, the Si source is reacted with the solid C source or the organic carbon compound, so that the silicon carbide is formed through following reaction formulas 1 to 3.

  [Reaction formula 1]

  [Reaction formula 2]

  [Reaction formula 3]

In order to facilitate the above reaction, the heating temperature may be set to 1300° C. or above. According to the method of preparing SiC powders of the embodiment, If the heating temperature is set in the range of 1300° C. to 1900° C., the fabricated SiC may have the β type, which is the low-temperature stable phase. If the heating temperature is set to less than 1300° C., the synthetic reaction may not smoothly occur. If the heating temperature is set to more than 1900° C., α-SiC may be formed instead of β-SiC. The β-SiC consists of fine particles, so the strength of the SiC can be improved, and may have more improved purity as compared with the α-SiC. The synthesis process may be performed for about 1 hour to about 7 hours.

Step ST 20 may be performed in the inert gas atmosphere or the vacuum atmosphere in order to prevent the undesired side reaction during the synthesis process for the SiC powders. However, the embodiment is not limited thereto. That is, the heating process may be performed in various atmospheres.

The SiC powders formed through the reaction may have the grain size of about 10 μm or more. Preferably, the SiC powders formed through the reaction may have the grain size in the range of about 10 μm to about 100 μm. More preferably, the SiC powders formed through the reaction may have the grain size of about 10 μm to about 50 μm. More preferably, the SiC powders may have the grain size of about 10 μm to about 20 μm.

The SiC powders may be formed with the grain size of about 10 μm or more by combining SiC and SiC seeds formed through the reaction of the Si source and the C source.

In other words, the SiC seed serves as a core of the SiC after the reaction has been performed, and the SiC formed through the reaction is combined with the core, so that grains can be grown. Accordingly, the SiC powders having the grain size of about 10 μm or more may be formed. In this case, the grain size of the SiC seed serving as the core may be in the range of about 0.5 μm to about 5 μm.

In general, the SiC powders, which is formed through the reaction of the Si source and the C source, have the grain size of about 0.5 μm to about 5 μm. However, since the silicon carbide powder formed through the reaction is added to the SiC seed, so that the SiC seed serves as the core of the grain growth. Accordingly, the SiC powders formed through the final reaction may have the grain size of about 10 μm or above.

In addition, since the SiC seed having the average grain size of about 0.5 μm to about 5 μm is used as the core in the grain growth, the high-purity SiC powders can be prepared. Preferably, the β-SiC powders having the high purity of about 99.999% to about 99.99999999% may be prepared.

Further, the SiC powders according to the embodiment may have a hexahedral shape or a dodecahedral shape. Thus, the SiC powders may have a desired shape as compared with the SiC powders prepared through the CVD process.

Hereinafter, the method of preparing the SiC powders according to the preparation examples and comparative example will be described in more detail. The following preparation examples are illustrative purpose only and the disclosure is not limited to the preparation examples.

Preparation Example 1

60 g of fumed silica, 36 g of carbon black, and about 2.1 g of SiC powders was mixed to prepare mixture 1. At this time, the SiC powders had β-crystal phase and an average grain size of 1 μm.

After that, the mixture 1 was subject to the synthesis process at the temperature of about 1700° C. for three hours while rising the temperature at the rate of 5° C./min, thereby forming silicon carbide powder 1.

Preparation Example 2

Mixture 2 was prepared by mixing fumed silica and carbon black under the same composition and same condition of preparation example 1 except that about 4.4 g of SiC powders was added.

Then, the synthesis process was carried out under the same condition of preparation example 1, thereby forming SiC powders 2.

Comparative Example 1

Mixture 3 was prepared by mixing fumed silica and carbon black under the same composition and same condition of manufacture example 1 except that SiC powders were not employed.

Then, the synthesis process was carried out under the same condition of preparation example 1, thereby forming SiC powders 3.

Comparative Example 2

Mixture 4 was prepared by mixing fumed silica and carbon black under the same composition and same condition of manufacture example 1 except that 26.5 g of SiC powders were employed.

Then, the synthesis process was carried out under the same condition of preparation example 1, thereby forming SiC powders 4.

Comparative Example 3

Then, the synthesis process was carried out with respect to the SiC powders, which had no fumed silica and carbon black, included a β crystal phase, and had the average grain size of 1 μm, under the same condition of preparation example 1, thereby forming SiC powders 5.

TABLE 1

| | Average grain size (μm) |
|---|---|
| Preparation Example 1 | 15 |
| Preparation Example 2 | 7 |
| Comparative Example 1 | 1 |
| Comparative Example 2 | 1.2 |
| Comparative Example 3 | 3 |

Referring to Table 1, the average grain size of the silicon carbide powders according to preparation examples 1 and 2 is larger than that of the silicon carbide powders according to comparative examples 1 to 3. Accordingly, the grain size of the SiC powders can be increased by using the SiC seed. In other words, after adding the SiC seed to the Si source and the C source, the SiC seed and the Si source and the C source are mixed with each other and subject to the reaction. In this case, the grain size of the β-type SiC powders finally produced can be increased. On the contrary, if the SiC seeds are not introduced, or an excessive amount of SiC seeds are introduced, the grain size of the SiC powders is reduced.

In other words, the SiC seed having the β crystal phase with the grain size of 0.5 μm to 5 μm is mixed, so that the SiC seed serves as the core combined with the SiC in the reaction, so that the SiC seed can be grown grains, so that the β SiC powders having the grain size of 10 μm may be prepared.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of preparing beta-silicon carbide (β-SiC) powder comprising:
forming a mixture by mixing a silicon (Si) source, a carbon (C) source, and a silicon carbide (SiC) seed; and
reacting the mixture,
wherein a mole ratio or carbon (C) constituting the carbon (C) source to silicon (Si) constituting the silicon (Si) source is in a range of about 1:1.8 to about 1:2.7,
wherein a mole ratio between silicon carbide (SiC) and a sum of the silicon carbide (SiC) and the silicon (Si) source is in a range of about 0.01:1 to about 0.2:1, and
wherein the beta-silicon carbide (β-SiC) powder has a purity in a range of 99.999% to 99.99999999%.

2. The method of claim 1, wherein the silicon carbide (SiC) seed has a grain size in a range of about 0.5 μm to about 5 μm.

3. The method of claim 1, wherein the silicon carbide (SiC) seed has a β crystal phase.

4. The method of claim 1, wherein the silicon (Si) source includes at least one selected from the group consisting of silica sol, silicon dioxide, silicon fine powder, and quartz powder.

5. The method of claim 1, wherein the carbon (C) source includes a solid carbon source or an organic carbon compound.

6. The method of claim 5, wherein the solid carbon source includes at least one selected from the group consisting of carbon black, carbon nano-tube (CNT), and fullerene (C60).

7. The method of claim 5, wherein the organic carbon compound includes at least one selected from the group consisting of phenol resin, franc resin, xylene resin, polyimide, polyurethane, polyacrylonitrile, polyvinyl alcohol, cellulose, pitch, tar, and sugar.

8. The method of claim 1, wherein a mole ratio between silicon carbide (SiC) and a sum of the silicon carbide (SiC) and the silicon (Si) source is in a range of about 0.03:1 to about 0.1:1.

9. The method of claim 1, wherein the reacting of the mixture is performed at a temperature in a range of about 1300° C. to about 1900° C.

* * * * *